United States Patent
Yu et al.

(10) Patent No.: US 8,395,687 B2
(45) Date of Patent: Mar. 12, 2013

(54) METHODS FOR OPERATING IMAGE SENSORS

(75) Inventors: Yu-Yeon Yu, Osan-si (KR); Seok-Ha Lee, Seoul (KR); Do-Hwan Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1058 days.

(21) Appl. No.: 12/320,923

(22) Filed: Feb. 9, 2009

(65) Prior Publication Data

US 2009/0201396 A1 Aug. 13, 2009

(30) Foreign Application Priority Data

Feb. 11, 2008 (KR) .................... 10-2008-0012265

(51) Int. Cl.
*H04N 3/14* (2006.01)
(52) U.S. Cl. ........................................ 348/308
(58) Field of Classification Search .............. 348/308, 348/222, 241, 248, 294, 299, 314; 250/208.1, 250/214 R
See application file for complete search history.

(56) References Cited

U.S. PATENT DOCUMENTS

| | | | |
|---|---|---|---|
| 4,926,225 A * | 5/1990 | Hosack | 257/225 |
| 5,623,306 A * | 4/1997 | Kajihara et al. | 348/243 |
| 7,414,233 B2 * | 8/2008 | Asaba | 250/208.1 |
| 7,612,819 B2 * | 11/2009 | Nam | 348/308 |
| 7,920,193 B2 * | 4/2011 | Ladd et al. | 348/308 |
| 8,169,010 B2 * | 5/2012 | Kim et al. | 257/292 |

FOREIGN PATENT DOCUMENTS

| | | |
|---|---|---|
| JP | 11-355664 | 12/1999 |
| KR | 10-0496469 | 6/2005 |
| KR | 10-0533249 | 11/2005 |

OTHER PUBLICATIONS

Abstract of KR 20040071836 published Aug. 16, 2004.
Abstract of KR 20040081655 published Sep. 22, 2004.

* cited by examiner

*Primary Examiner* — Thomas K Pham
*Assistant Examiner* — Vipin Patel
(74) *Attorney, Agent, or Firm* — Harness, Dickey & Pierce, P.L.C.

(57) ABSTRACT

A method for operating image sensors is provided. The method for operating image sensors includes maintaining a charge transmission unit which transfers charges generated in a photoelectric conversion unit by responding to incident light to a charge detection unit in an inactive state; and toggling the charge transmission unit between an active state and an inactive state while a reset unit resets the charge detection unit, wherein the toggling is repeated multiple times while a reset unit which resets the charge detection unit is maintained in active state.

13 Claims, 7 Drawing Sheets

METHODS FOR OPERATING IMAGE SENSORS

PRIORITY STATEMENT

This application claims priority under 35 U.S.C. §119 of Korean Patent Application No. 10-2008-0012265 filed on Feb. 11, 2008, in the Korean Intellectual Property Office, the entire contents of which are incorporated herein by reference.

BACKGROUND

1. Field

Example embodiments relate to methods for operating an image sensor. More particularly, example embodiments relate to an image sensor that may reduce and/or prevent the occurrence of blooming phenomenon.

2. Description of the Related Art

An image sensor transforms photonic images into electrical signals. Recent advances in computer and communication industries have led to strong demands in high performance image sensors in various consumer electronic devices including digital cameras, camcorders, PCSs (Personal Communication Systems), game devices, security cameras, and medical micro cameras.

Specifically, a CMOS image sensor has simple operating methods and may be implemented using various scanning methods. The size of a product may be minimized since signal processing circuits may be integrated into a single chip. Additionally, the fabricating cost may be reduced since MOS process technologies may be reused. Also, CMOS image sensors may require relatively small power consumption, which may be useful in battery-powered applications. The use of CMOS image sensors has been rapidly increasing as a result of these advances in implementation of high resolution CMOS image sensors.

Conventional image sensors may be formed from multiple active pixels. Each unit pixel may include a photoelectric conversion unit that responds to incident light and generates charges. Each unit pixel may also include a charge transmission unit that transfers charges generated to a charge read unit.

However, in conventional image sensors, a relatively high illumination may charge a unit pixel's photodiode to beyond capacity, which may lead to blooming phenomenon, where charges overflow into neighboring photodiodes.

Conventional methods to prevent blooming may include installing an overflow drain which is adjacent to a photoelectric conversion unit or installing a separate gate. However, these methods may not completely prevent blooming and may decrease sensitivity.

SUMMARY OF EXAMPLE EMBODIMENTS

Example embodiments provide a method of operating an image sensor having a reduced low illumination and a reduced and/or eliminated blooming phenomenon.

Example embodiments should not be construed as being limited to the above object, and the above stated objects as well as other objects, features and advantages of the example embodiments will become clear to those skilled in the art upon review of the following description.

Example embodiments may provide an operating method of an image sensor, comprising a preliminary charge integration phase that maintains a charge transmission unit in an inactive state, which may transfer charges generated in a photoelectric conversion unit by responding to light incident upon a charge detection unit. The preliminary charge integration phase may include toggling the charge transmission unit between an active state and an inactive state while a reset unit resets the charge detection unit while a reset unit which resets the charge detection unit is maintained in active state. According to example embodiments, the toggling may be repeated multiple times.

According to example embodiments, the charge detection unit may be maintained in an inactive state and the reset unit may be maintained in an active state during the toggling. According to example embodiments, a time period of maintaining the charge transmission unit in the inactive state may be longer than a time period of maintaining the charge transmission unit in the active state.

According to example embodiments, charges integrated in the photoelectric conversion unit may not exceed an electrical potential barrier of the photoelectric conversion unit while the charge transmission unit is in the inactive state.

Example embodiments may further include a charge integration phase which may maintain the reset unit and the charge transmission unit in an inactive state. In example embodiments, the charge integration phase may occur after the preliminary charge integration phase.

Example embodiments may further provide a residual charge removal phase, which may occur after the charge integration phase. The residual charge removal phase may maintain a row selection signal in an inactive state while the charge transmission unit toggles between an active state and an inactive state and a reset unit resets the charge detection unit. According to example embodiments, the toggling may be repeated multiple times.

According to example embodiments, a ratio of time for the preliminary charge integration phase to the charge integration phase may be between about 4:1 and about 6:1. Furthermore, a summation of time for the preliminary charge integration phase and the charge integration phase may be between about ¼ second and about ⅓ second.

According to example embodiments, the charge integration phase may be executed for about 10 milliseconds to about 66 milliseconds.

Example embodiments may further include a charge detection phase, which may switch the charge transmission unit from the inactive state to the active state to detect charges. According to example embodiments, the charge detection phase may occur after the charge integration phase.

Example embodiments may further provide a read-out phase, which may read a signal transferred by the charge transmission unit while the row selection signal is maintained in the active state. According to example embodiments, the read-out phase may occur after the charge integration phase.

DETAILED DESCRIPTION

Figure 1:
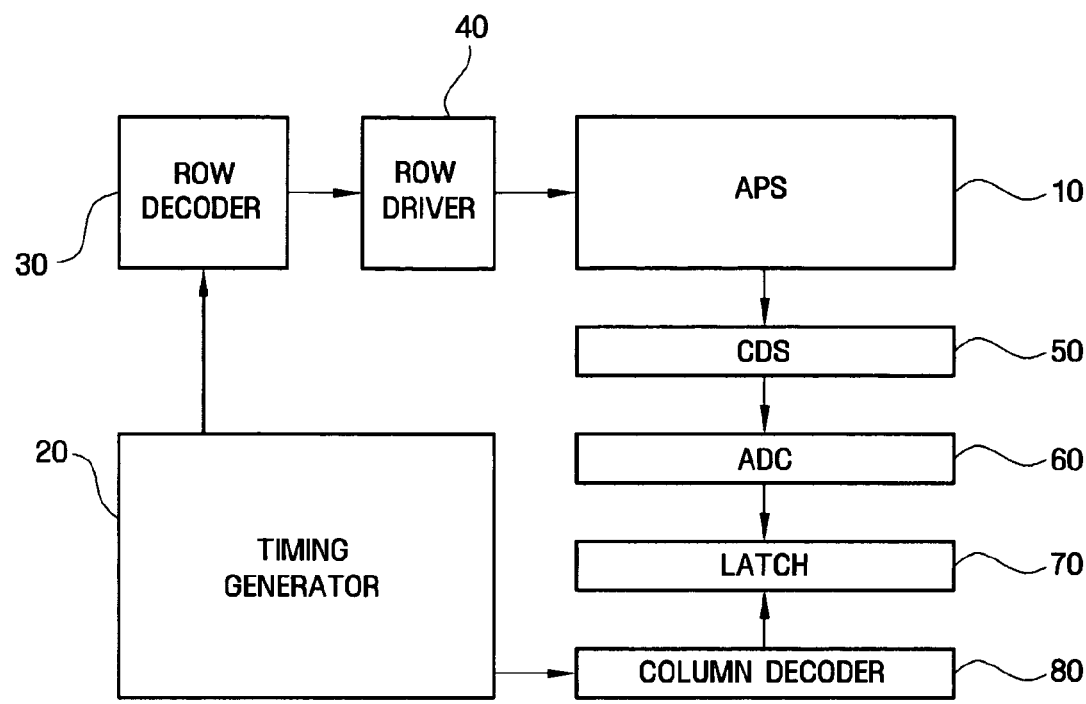
FIG. 1 is a block diagram illustrating an image sensor according to example embodiments.

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the example embodiments set forth herein.

It should be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms a "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. Throughout the drawings, like reference numerals refer to like elements.

FIG. 1 is a block diagram illustrating an image sensor according to example embodiments.

Referring to FIG. 1, an image sensor according to example embodiments may include an active pixel sensor APS array 10 which may consist of two dimensional arrays of pixels having photoelectric transformation devices, a timing generator 20, a row decoder 30, a row driver 40, a Correlated Double Sampler CDS 50, an Analog-to-Digital Converter ADC 60, a latch 70, and a column decoder 80.

The APS array 10 may include unit pixels arranged in two dimensions. The unit pixels may transform photonic images into electrical signals. The APS array 10 may be driven by multiple driving signals from the row driver 40 including a selection signal SEL, a reset signal RX, and a charge transmission signal TX. The electrically transformed output signals may be delivered to the correlated double sampler 50 through vertical signal lines.

The timing generator 20 may provide the row decoder 30 and the column decoder 80 with timing and control signals.

The row driver 40 may provide the APS array 10 with multiple driving signals to drive multiple unit pixels based on decoding result from the row decoder 30. In general, if the unit pixels are arranged in a matrix fashion, the driving signals may be provided for each row.

The correlated double sampler 50 may receive electrical signals generated in the APS array region 10 through vertical signal lines and perform hold and sample operations. In more detail, the correlated double sampler 50 may double-sample a noise level and a signal level of the APS array output. The correlated double sampler 50 may then output a differential level between the noise level and the signal level.

The analog to digital converter 60 may convert analog signals corresponding to level of signal difference to digital signals and output the digital signals.

The latch 70 may latch digital signals, which may be sequentially sent to an image signal processing unit (not shown) according to decoding results from the column decoder 80.

Figure 2:
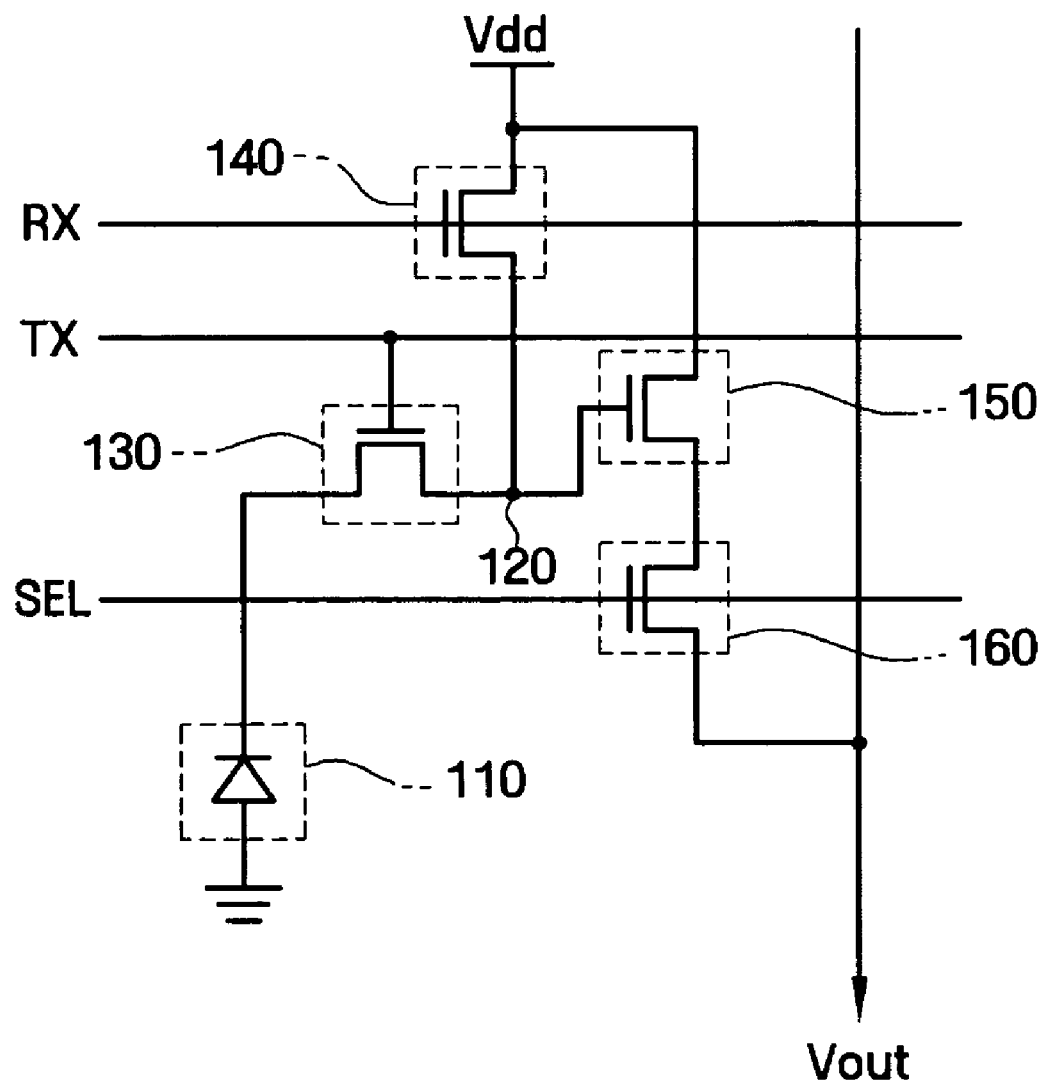
FIG. 2 is a circuit diagram illustrating a unit pixel used in an image sensor according to example embodiments.
Figure 3:
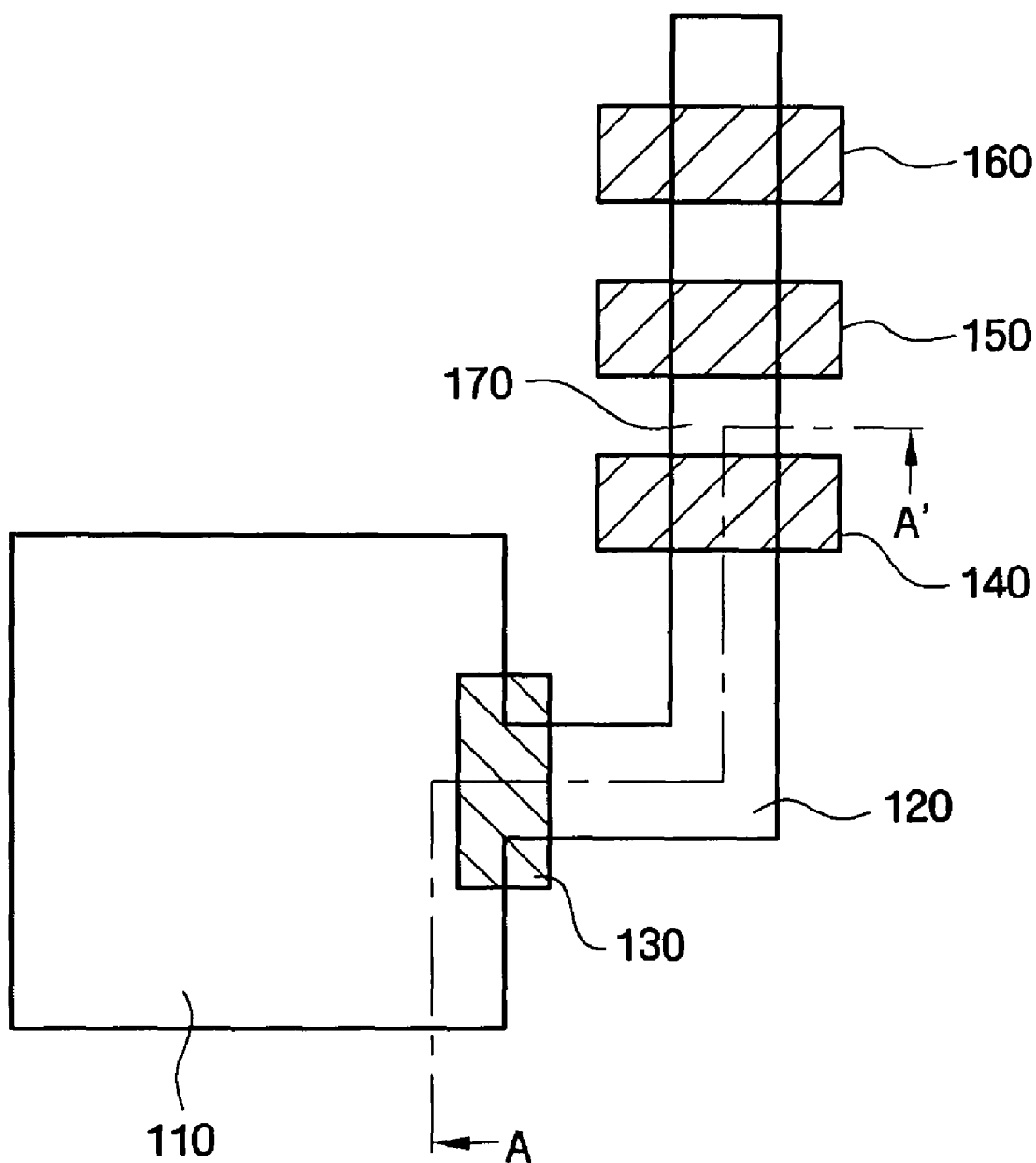
FIG. 3 is a schematic top view illustrating a unit pixel of an image sensor according to example embodiments.
Figure 4:
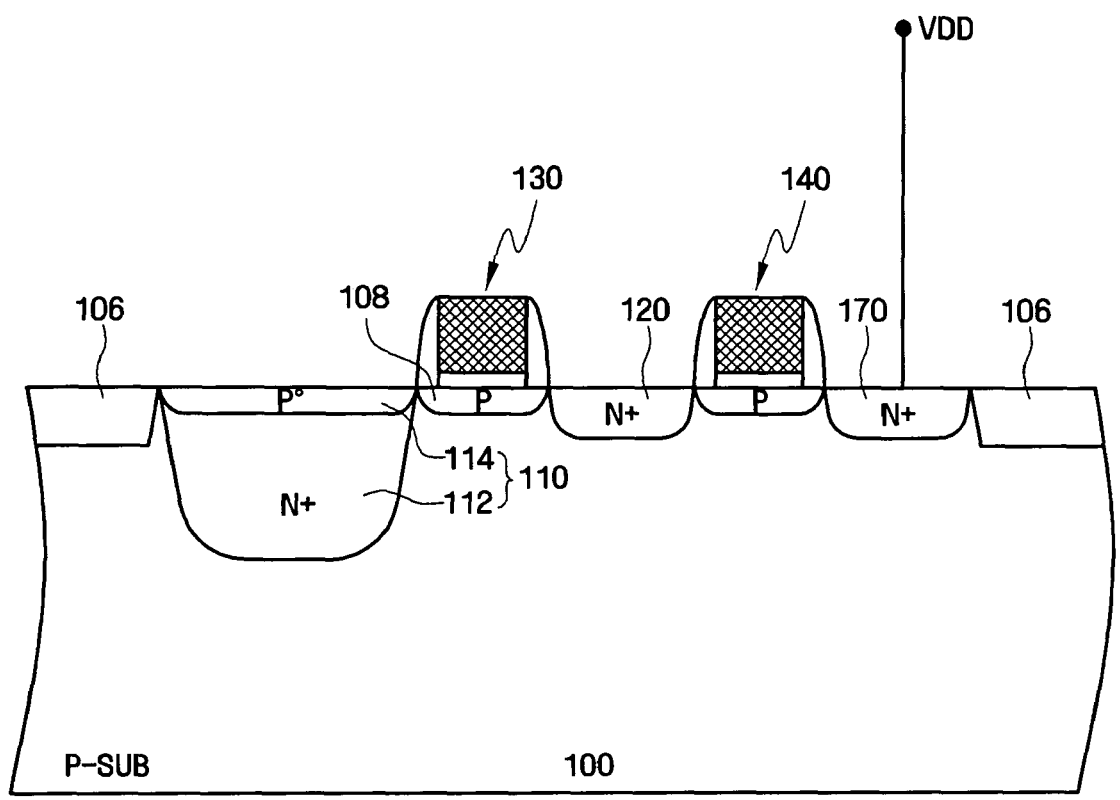
FIG. 4 is a sectional view taken along a line A-A' of FIG. 3 according to an example embodiment.

FIG. 2 is a circuit diagram illustrating a unit pixel used in an image sensor according to example embodiments. FIG. 3 is a schematic top view illustrating a unit pixel of an image sensor according to example embodiments. FIG. 4 is a sectional view taken along a line A-A' of FIG. 3 according to example embodiments. In FIGS. 2 and 3, although a unit pixel having four transistors is illustrated as an example, it is not limitative. For example, example embodiments may be applied to a unit pixel including three transistors or five transistors.

First, referring to FIGS. 2 and 3, a unit pixel of an image sensor, according to example embodiments, may include a photoelectric conversion unit 110, a charge detection unit 120, a charge transmission unit 130, a reset unit 140, an amplification unit 150, and a selection unit 160.

The photoelectric conversion unit 110 may absorb light energy reflected from an object and accumulate charges generated. A photo diode, a photo transistor, a photo gate, a Pinned Photo Diode; PPD, and/or combinations of these devices may be used as the photoelectric conversion unit 110.

A FD (Floating Diffusion region) may be used as a charge detection unit 120, which may receive charges accumulated in the photoelectric conversion unit 110. The charge detection unit 120 may be electrically connected to a gate of the amplification unit 150 and may control an amplification unit 150.

The charge transmission unit 130 may transfer charges from the photoelectric conversion unit 110 to the charge detection unit 120. The charge transmission unit 130 may include one transistor and may be controlled by a charge transmission signal TX.

The reset unit 140 may reset the charge detection unit 120 periodically. The reset unit may be coupled between a voltage node to which a supply voltage VDD is applied and the charge detection unit 120. The reset unit 140 may be driven by a reset signal RX from a gate. When the reset unit 140 is turned on by the reset signal RX, the supply voltage VDD may be delivered to the charge detection unit 120 to reset the charge detection unit 120.

The amplification unit 150 combined with a current source (not shown) located outside of a unit pixel may serve as a source follower buffer amplifier and may output a voltage which may vary according to the voltage of the charge detection unit 120 through a vertical signal line.

The selection unit 160 may select unit pixels to be read out per row. The selection unit 160 may be coupled with the amplification unit 150, and may be driven by a selection signal SEL from a gate.

The drive lines of the charge transmission device 130, the reset device 140, and the selection device 160 may be extended to the row direction (horizontal direction) to drive the unit pixels included in the same row simultaneously.

Referring to FIG. 4, a unit pixel of an image sensor according to the example embodiments may include a semiconductor substrate 100, a device isolation region 106, a photoelectric conversion unit 110, a charge detection unit 120, and a charge transmission unit 130. The photoelectric conversion unit 110 pictured in FIG. 4 may be a pinned photo diode PPD, for example.

According to example embodiments and FIG. 4, a p-type substrate may be used as the semiconductor substrate 100, which may include an active region and a device isolation region. Although not shown in the drawings, by growing a p-type epitaxial layer on the semiconductor substrate 100 or forming a separate well region, the photoelectric conversion unit 110 and the charge transmission unit 130 may be formed on the p-type epitaxial layer and/or on the well region.

The device isolation region 106 may define an active region on the semiconductor substrate 100. A FOX (Field Oxide) may be formed on device isolation region 106 using a LOCOS (Local Oxidation of Silicon) method or STI (Shallow Trench Isolation). The device isolation region 106 may be composed of a diffusion layer having higher impurity density than the substrate impurity density and may isolate each unit pixel. Thus, if the photoelectric conversion unit 110 is n-type, the device isolation region 106, for example, may be formed by ion implantation of a p-type impurity.

The photoelectric conversion unit 110 may accumulate charges generated by absorbing light energy. The photoelectric conversion unit 110 may include an $n^+$ type photo diode 112 and a $p^+$ type pinning layer 114. The photo diode and the pinning layer 114 may be formed by two different ion implantation processes. In more detail, the photo diode 112 may be formed by performing ion implantation of $n^+$ dopant deeper than a surrounding source and drain. The pinning layer 114 may be formed by performing ion implantation using $p^+$ dopant with low energy and a high dosage. The doping density and location is not limitative and may vary depending on fabrication process and design.

The charge detection unit 120 may receive charges accumulated in the photoelectric conversion unit 110 through the charge transmission unit 130. The charge detection unit 120 may be formed by ion implanting $n^+$ dopant.

The charge transmission unit 130 may use an enhancement type transistor having a low threshold voltage Vth to prevent overflow and blooming phenomenon, which may occur in the photoelectric conversion unit 110 due to excessive light energy or a depletion type transistor.

In the charge transmission unit 130, blooming phenomenon may be decreased by implanting holes in a surface 108 of the semiconductor substrate 100. Holes may suppress charge generation temporarily by recombining with electrons. A source/drain 170 may store charges temporarily.

Figure 5:
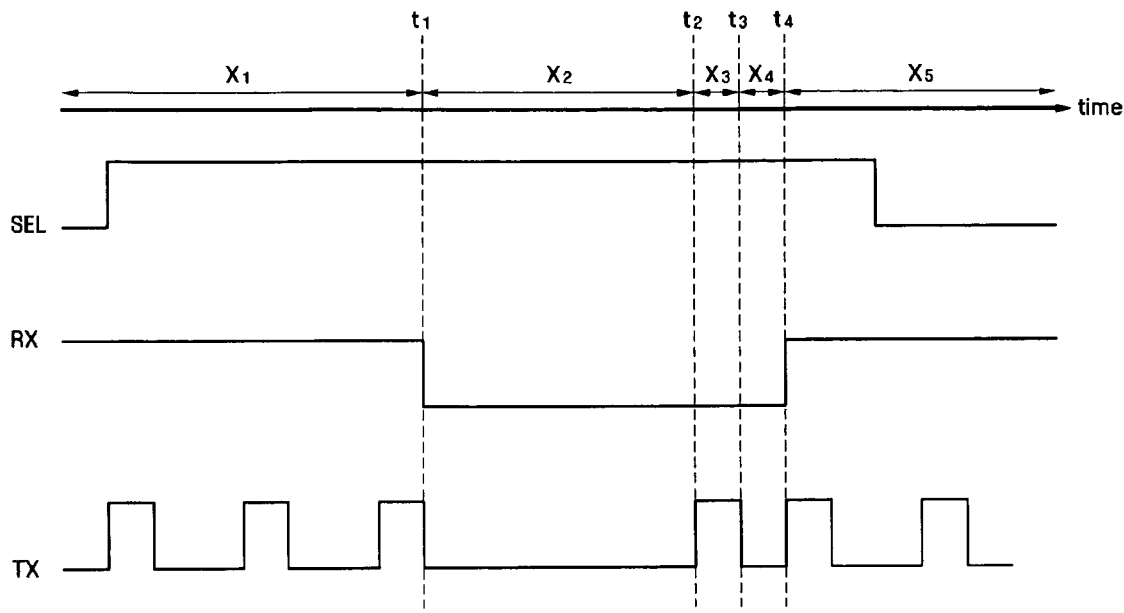
FIG. 5 is a timing diagram illustrating an image sensor according to example embodiments.
Figure 6A:
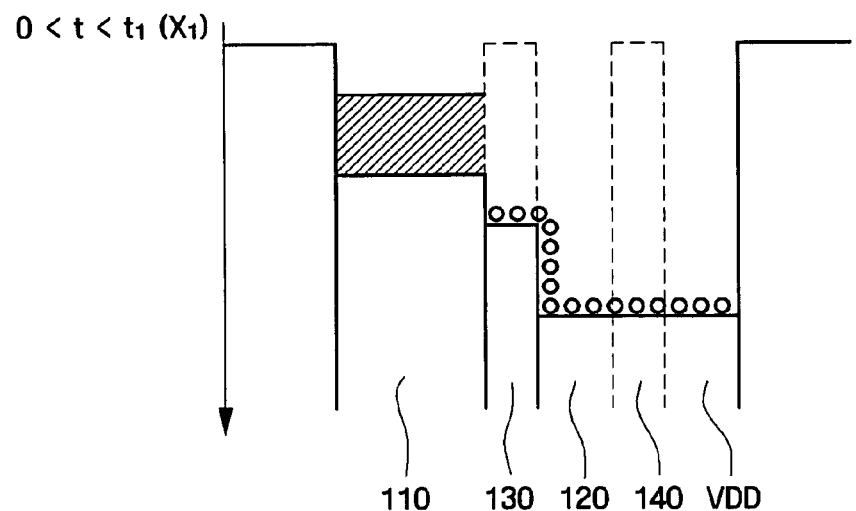
FIGS. 6A through 6C are potential diagrams with respect to timing illustrating an image sensor according to example embodiments.
Figure 6B:
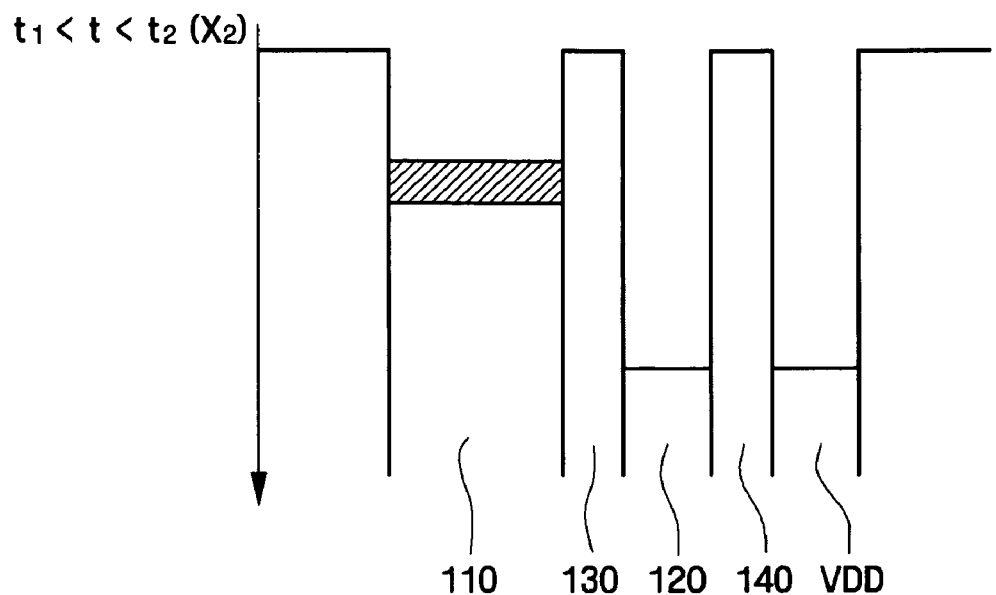
Figure 6C:
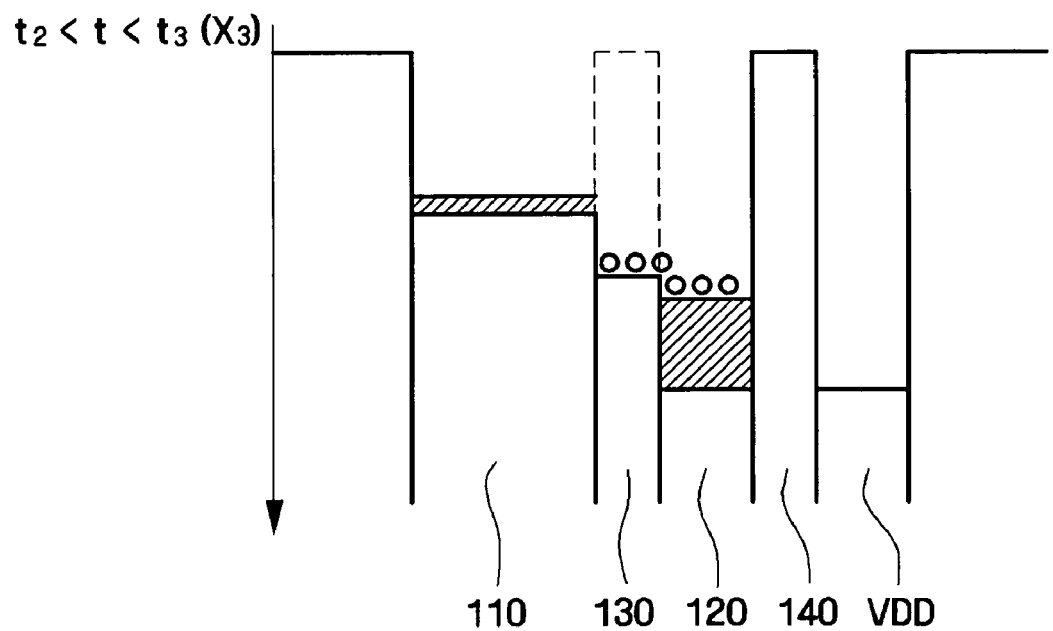

FIGS. 4 through 6C describe operations of an image sensor according to example embodiments. FIG. 5 is a timing diagram illustrating an image sensor according to example embodiments. FIGS. 6A through 6C are potential diagrams with respect to timing illustrating an image sensor according to example embodiments.

FIGS. 4 through 6C may further describe operations of an image sensor using a photo diode as a photoelectric conversion unit 10. In general, unit pixels located in an active pixel sensor array 10 may integrate charges. A reset signal RX and a row selection signal SEL may be common signals to the unit pixels located in a specific row of the active pixel sensor array 10. Thus, unit pixels located in a specific row may receive a unique reset signal RX and row selection signal SEL.

The active pixel sensor array 10 may be composed of N rows, and each row may sequentially read in the order of ROW(1) . . . , ROW(i), ROW(i+1) . . . , ROW(N). The row driver 40 driven by a control unit (not shown) may provide the active pixel sensor array 10 with the row selection signal SEL, the reset signal RX, and a charge transmission signal TX. The active pixel sensor array 10 may accumulate charges by receiving multiple signals (SEL, RX, and TX) and transmitting the accumulated charges to a charge detection unit 120. The charge detection unit 120 may double-sample noise level and signal level.

The operations of an image sensor may include NIT (Not Integration Time) and EIT (Effective Integration Time). NIT may be a time period when no charge is integrated in the photoelectric conversion unit 110. EIT may be a time period when charge is integrated in the photoelectric conversion unit 110. The NIT in example embodiments may include a preliminary charge integration phase and a residual charge removal phase. The preliminary charge integration phase may be a state where the corresponding unit pixel is selected. The residual charge removal phase may remove residual charges in the photoelectric conversion unit after a reading signal.

The ratio of the preliminary charge integration phase to the charge integration phase may be 4:1 or 6:1. When the ratio exceeds 6:1, the preliminary charge integration phase becomes too long and charges integrated in the photoelectric conversion unit 110 may not be controlled easily. When the ratio is less than 4:1, an overflow may occur during the charge integration phase. The sum of preliminary charge integration phase and charge integration phase, for example, may be ¼ second or ⅓ second. According to example embodiments, the charge integration phase may be performed for 10 ms to 66 ms. When the charge integration phase exceeds 66 ms, an overflow may occur due to excessive charges integrated in the photoelectric conversion unit 110 during the charge integration phase. When the charge integration phase is less than 10 ms, it may be difficult to control charges integrated during the preliminary charge integration phase.

According to FIGS. 5 and 6A, the time period until t1 ($0<t<t_1$: $X_1$) may indicate a selection state. If the row selection signal SEL(i) becomes high, a selection unit 160 may be in an active state. Thus, the charges integrated in the photo detection unit 120 may be prepared to be read through a vertical signal line connected to the selected unit pixel. In this step, the reset signal RX(i) may become high at the same time, and the photo detection unit 120 may be reset to Vdd while the reset unit 140 is in an active state. It is not necessary to set both the row selection signal SEL(i) and the reset signal RX(i) to high simultaneously. The reset signal RX(i) may be set to high at a later time. The reset signal RX(i) may maintain an active state during the X1 period. The X1 period is a NIT, which may be the preliminary charge integration phase. During period X1, no charge may be integrated in the photoelectric conversion unit 110. However, when illumination is high, the charge transmission signal TX(i) may be in an active state periodically to prevent blooming phenomenon where excess charges generated in the photo transformation unit 110 overflows to the photoelectric conversion unit of a neighboring pixel.

During the preliminary charge integration phase X1, the charge transmission signal TX(i) may be repeatedly switched between in an inactive state and an active state, which results in an operation that switches the charge transmission unit 130 from an inactive state to an active state. According to example embodiments, the time period when the charge transmission unit 130 is in an inactive state may be longer than the time period when the charge transmission unit 130 is in an active state. During the time period when the charge transmission unit 130 is inactive, the number of active states of the charge transmission unit 130 and the period of each active state may be controlled to prevent charges integrated in the photoelectric conversion unit 110 from exceeding an electrical potential barrier of the photoelectric conversion unit 110. As illustrated in FIG. 6A, the charges generated in the photoelectric conversion unit 110 may be transferred to the charge detection unit 120 by maintaining the charge transmission unit 130 in an active state, while the charges in the charge detection unit 120 may be externally discharged. Since charge overflow does not occur even in the case of excessive charge generated in the photoelectric conversion unit 110, blooming phenomenon may be prevented.

Although not shown in the drawings, by maintaining the reset signal RX(i) and the charge transmission signal TX(i) of a row selected during the preliminary charge integration phase (X1) blooming phenomenon may be prevented. According to example embodiments, the photoelectric conversion unit 110 and the charge detection unit 120 may be maintained in an active state.

Referring to FIGS. 5 and 6B, during the charge integration phase ($X_2$: $t_1 < t < t_2$), the reset signal RX(i) and the charge transmission signal TX(i) may be driven low to maintain the reset unit 140 and the charge transmission unit 130 in an inactive state. The reset signal RX(i) and the charge transmission signal TX(i) may not be required to be low simultaneously. When the reset signal RX(i) becomes low, an offset level different from each pixel, which is a noise level, may be read through a vertical signal line. Although not shown in the drawings, the noise level on the vertical signal line may be stored in a correlated double sampler 50. Also, as illustrated in FIG. 6B, charges may be integrated in the photoelectric conversion unit 110. The charges integrated in the photoelectric conversion unit 110 during the charge integration phase X2 may control the period of the charge integration phase X2 so that the electric potential barrier of the photoelectric conversion unit 110 may not overflow.

Referring to FIGS. 5 and 6C, during period X3 ($X_3$: $t_2 < t < t_3$), when the charge transmission signal TX(i) becomes high, the charge transmission unit 130 may be activated. As illustrated in FIG. 6C, charges from the photoelectric conversion unit 110 may be transferred to the charge detection unit 120. Since the charge detection unit 120 contains parasitic capacitance charges may be accumulated. As a result, the electric potential of the charge detection unit 120 may change. According to example embodiments, the reset signal RX(i) may be set to the inactive state to maintain the reset unit 140 to be in an inactive state, and charges from the photoelectric conversion unit 110 may be transferred to the charge detection unit 120. The period X3 may be referred to as a charge transmission phase.

According to FIG. 5, during period X4 ($X_4$: $t_3 < t < t_4$), the charge transmission signal TX(i) may become low. When the charge transmission signal TX(i) becomes low, the changed electric potential of the charge detection unit 120, which is a signal level, may be read through a vertical signal line. Although not shown in the drawings, the signal level on the vertical signal line may be stored in the correlated double sampler 50, and the reset signal RX(i) may be set to the inactive state. The period X4 may be referred to as a read-out phase.

Consequently, a noise level and a signal level may be sequentially sampled from one unit pixel. Also, the signal level may be sampled first followed by sampling the noise level.

According to FIG. 5, during a residual charge removal phase ($X_5$: $t_4 < t$) the row selection signal SEL(i) may become low. Although the row selection signal SEL(i) may become low at the same time when the row selection signal SEL(i+1) becomes high, it is not limitative. The time when the row selection signal SEL(i) becomes low may be controlled such that the signal level may be read sufficiently through the vertical signal line to save power consumption. During the period when another pixel (i+1 pixel) is selected, residual charge may be removed in order to prevent blooming phenomenon that may occur in the photoelectric conversion unit 110 of an unselected pixel (i pixel). While the reset unit 140 may be maintained in an active state by maintaining the reset signal RX(i) in high, an operation that switches the charge transmission signal TX(i) from an inactive state to an active state may be performed multiple times, which results in repeatedly switching the charge transmission unit 130 from an inactive state to an active state. This operation may be identical to operations performed in the X1 phase. As a result, during the period when the pixel is not selected, the residual charges in the photoelectric conversion unit 110 may be removed, and blooming phenomenon may be prevented. Similar to the preliminary charge integration phase (X1), the time period when the charge transmission unit 130 is in an inactive state may longer than the time period when the charge transmission unit 130 is in an active state. During the time period when the charge transmission unit 130 is in an inactive state, the number of active states of the charge transmission unit 130 and the period of each active state is controlled to prevent charges integrated in the photoelectric conversion unit 110 from exceeding the electrical potential barrier of the photoelectric conversion unit 110.

Although not shown in the drawings, according to example embodiments, during the time period when the row selection signal SEL(i) is low and the selection unit 160 is inactive, the reset signal RX(i) and the charge transmission signal TX(i) of the unselected row may be set to high to prevent blooming phenomenon. According to example embodiments, the photoelectric conversion unit 110 and the charge detection unit 120 may be in an active state.

As described above, an image sensor according to example embodiments may minimize and/or eliminate blooming by changing operating methods of the charge transmission unit without modification to the structure of an active pixel sensor array. Furthermore, since additional reverse bias to a substrate or an additional gate or ion implantation region may not be required, without decreasing any effective fill factor, a sensor's sensitivity may be maintained and/or blooming phenomenon may be prevented.

Figure 7:
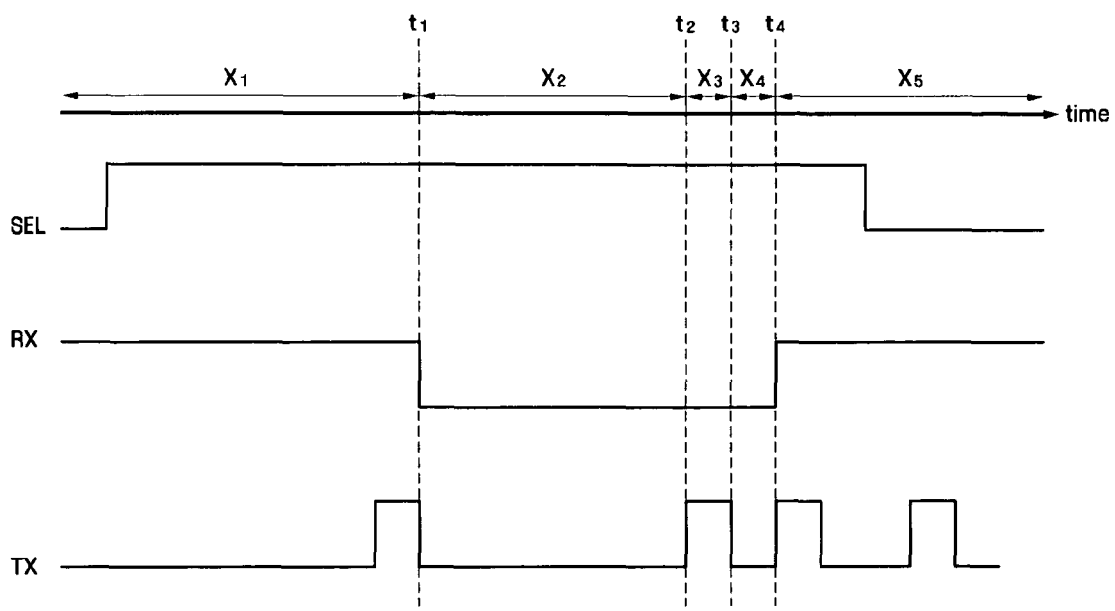
FIG. 7 is a timing diagram illustrating an image sensor according to another example embodiment.

FIG. 7 is a timing diagram illustrating operating methods of an image sensor according example embodiments. The description of the devices and operating methods illustrated in FIG. 7 may be identical to the previous descriptions, and therefore, have been omitted.

Referring to FIG. 7, a period until time t1 ($0 < t < t_1$: $X_1$) may refer to a selection state. When a row selection signal SEL(i) becomes high, a selection unit 160 may be activated. Thus, the charges stored in a charge detection unit 120 may be prepared to be read through a vertical signal line connected to a selected unit pixel. According to example embodiments, a reset signal RX(i) becomes high simultaneously, and the charge detection unit 120 may be reset to Vdd during the time period when the reset unit 140 is in an active state. Here, setting the row selection signal SEL(i) and the reset signal RX(i) high simultaneously may not be required. The reset signal RX(i) may be set to high later. The reset signal RX(i) may be set to high during the time period X1. During this period, a charge transmission signal TX(i) may be initially in an inactive state and may become active to initialize the photoelectric conversion unit 110 before a charge integration phase (X2). This period may not integrate charges in the photoelectric conversion unit 110 substantially and may be referred to as NIT (NIT: Not Integration Time) or the preliminary charge integration phase. If the charges integrated in the photoelectric conversion unit 110 are sufficiently removed before the row selection signal SEL(i) becomes high, the charge overflow from the photoelectric conversion unit 110, which is blooming phenomenon, may be prevented without performing a separate charge removal operation.

During the time period when the row selection signal SEL(i) is maintained in an active state, the charge integration phase X2 ($X_2$: $t_1<t<t_2$), a charge transmission phase X3 ($X_3$: $t_2<t<t_3$), and a charge read-out phase X4 ($X_4$: $t_3<t<t_4$) may be executed. During these phases, charges may be integrated in the photoelectric conversion unit 110, and the signal level may be read by transmitting the integrated charges to the charge detection unit 120. The charges integrated in the photoelectric conversion unit 110 during the charge integration phase X2 may be controlled to not exceed an electric potential barrier of the photoelectric conversion unit 110. In order to achieve this, the charge integration phase X2 may be performed for 10 ms to 66 ms.

During a residual charge removal phase X5 ($X_5$: $t_4<t$), a cycle including a phase that maintains a charge transmission unit 130 in an inactive state and another phase that maintains the charge transmission unit 130 in an active state may be repeated more than two times. According to example embodiments, the row selection signal SEL(i) may be maintained in an inactive state. At the same time, a reset unit 140 which resets the charge detection unit 120 may be maintained in an active state. While the reset unit 140 is maintained in active state by maintaining the row selection signal SEL(i) low and the reset signal RX(i) high, an operation that switches the charge transmission signal TX(i) from an inactive state to an active state may be performed multiple times, which results in repeatedly switching the charge transmission unit 130 from an inactive state to an active state. During the period when other pixel (i+1 pixel) is selected, residual charge may be removed in order to prevent blooming phenomenon that may occur in a photoelectric conversion unit 110 of an unselected pixel (i pixel). The time period when the charge transmission unit 130 is in an inactive state is longer than the time period when the charge transmission unit 130 is in an active state.

According to example embodiments, when the row selection signal SEL(i) is high, the device reliability may be minimized and blooming phenomenon may be prevented by minimizing the time period when the charge transmission unit 130 is maintained in an active state.

Example embodiments have been described for illustrative purposes, and those skilled in the art will appreciate that various modifications, additions and substitutions are possible, without departing from the scope and spirit of the following claims.

What is claimed is:

1. An operating method of an image sensor, comprising a preliminary charge integration phase that performs an operation that switches a charge transmission unit that transfers charges generated in the photoelectric conversion unit by responding to incident light to a charge detection unit from inactive state to an active state multiple times while the reset unit that resets the charge detection unit operates in an active state throughout the switching; and
performing a charge integration that operates the charge transmission unit in an inactive state while the reset unit operates in an inactive state after the preliminary charge integration, wherein during the preliminary charge integration, the charge transmission unit is in inactive state longer than in the active state, and performing the preliminary charge integration and the charge integration takes a total time period of between about ¼ second and about ⅓ second.

2. The method of claim 1, wherein a ratio of time of the preliminary charge integration phase and the charge integration phase is between about 4:1 and about 6:1.

3. The method of claim 1, wherein charges integrated in the photoelectric conversion unit do not exceed an electrical potential barrier of the photoelectric conversion unit.

4. The method of claim 3, wherein the charge integration phase is executed for about 10 milliseconds to about 66 milliseconds.

5. The method of claim 1, wherein charges integrated in the photoelectric conversion unit do not exceed an electrical potential barrier of the photoelectric conversion unit while the charge transmission unit is operate in the inactive state.

6. The method of claim 1, further comprising:
switching the charge transmission unit from an inactive state to an active state to detect charges.

7. The method of claim 6, further comprising:
switches the charge transmission unit from an inactive state to an active state multiple times while maintaining a row selection signal in an inactive state and operating the reset unit which resets the charge detection unit in an active state.

8. An operating method of an image sensor, comprising:
performing a preliminary charge integration that switches a charge transmission unit that transfers charges generated in a photoelectric conversion unit by responding to incident light to a charge detection unit from an inactive state to an active state multiple times while a reset unit that resets the charge detection unit operates in an active state throughout the switching;
performing a charge integration that operates the charge transmission unit in an inactive state while the reset unit operates in an inactive state after the preliminary charge integration, wherein during the preliminary charge integration, the charge transmission unit is in the inactive state longer than in the active state, and performing the preliminary charge integration and the charge integration takes a total time period of between about ¼ second and about ⅓ second;
reading a signal which is transferred by the charge transmission unit while a row selection signal is maintained in an active state; and
performing a charge removal wherein the charge transmission unit that transfers charges generated in a photoelectric conversion unit by responding to incident light to a charge detection unit switches from an inactive state to an active state multiple times while the row selection signal is maintained in an inactive state and the reset unit which resets the charge detection unit is operates in an active state throughout the charge removal.

9. The method of claim 8, wherein performing the charge integration is performed before reading the signal.

10. The method of claim 9, wherein, during the charge integration and the preliminary charge integration, charges integrated in the photoelectric conversion unit do not exceed an electric potential barrier of the photoelectric conversion unit.

11. The method of claim 10, wherein the method is performed for about 10 milliseconds to about 66 milliseconds.

12. The method claim 8, wherein, during the preliminary charge integration, the row selection signal is maintained in an active state.

13. The method of claim 8, wherein, during the cycle, charges removal, charges integrated in the photoelectric conversion unit do not exceed an electric potential barrier of the photoelectric conversion unit while the charge transmission unit is in an inactive state.

* * * * *